(12) United States Patent
Yamamoto

(10) Patent No.: US 10,818,242 B2
(45) Date of Patent: Oct. 27, 2020

(54) PIXEL CIRCUIT INCLUDING PLURALITY OF SWITCHING TRANSISTORS AND CAPACITORS, AND DISPLAY UNIT

(71) Applicant: JOLED Inc., Tokyo (JP)

(72) Inventor: Tetsuro Yamamoto, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/239,819

(22) Filed: Jan. 4, 2019

(65) Prior Publication Data

US 2019/0259339 A1 Aug. 22, 2019

(30) Foreign Application Priority Data

Feb. 22, 2018 (JP) .................................. 2018-029574

(51) Int. Cl.
G09G 3/3266 (2016.01)
H01L 27/32 (2006.01)

(52) U.S. Cl.
CPC ....... *G09G 3/3266* (2013.01); *H01L 27/3248* (2013.01); *H01L 27/3276* (2013.01)

(58) Field of Classification Search
CPC .................................................. G09G 3/3266
USPC .......................................................... 345/204
See application file for complete search history.

(56) References Cited

U.S. PATENT DOCUMENTS

| | | | | |
|---|---|---|---|---|
| 2004/0196223 A1* | 10/2004 | Kwon | .................. | G09G 3/3233 345/82 |
| 2007/0052644 A1* | 3/2007 | Uchino | ................ | G09G 3/3233 345/92 |
| 2015/0187273 A1* | 7/2015 | Chang | .................. | G09G 3/3233 345/690 |
| 2017/0103701 A1* | 4/2017 | Zhu | ....................... | G09G 3/3233 |
| 2018/0182346 A1* | 6/2018 | Ryu | ...................... | G09G 3/3688 |

FOREIGN PATENT DOCUMENTS

| | | |
|---|---|---|
| JP | 2006-030921 A | 2/2006 |
| JP | 2006-133543 A | 5/2006 |

* cited by examiner

*Primary Examiner* — Long D Pham
(74) *Attorney, Agent, or Firm* — Michael Best & Friedrich LLP

(57) ABSTRACT

A pixel circuit includes a driving transistor, a write transistor, a first switching transistor, a first storage capacitor, a second and third switching transistors, and a second storage capacitor. The driving transistor controls a current flowing in a light-emitting device. The write transistor controls application of a signal voltage to a source end of the driving transistor. The first switching transistor controls a gate voltage of the driving transistor during correction operation that allows a gate-source voltage of the driving transistor to come close to a threshold voltage of the driving transistor. The second switching and third switching transistors are provided, in series, at an electrically conductive path between the source end of the driving transistor and a first voltage line.

20 Claims, 15 Drawing Sheets

$Vx=Vss+Vth+g(Vsig-Vss)$

PIXEL CIRCUIT INCLUDING PLURALITY OF SWITCHING TRANSISTORS AND CAPACITORS, AND DISPLAY UNIT

CROSS REFERENCE TO RELATED APPLICATIONS

This application claims the benefit of Japanese Priority Patent Application JP 2018-029574 filed on Feb. 22, 2018, the entire contents of which are incorporated herein by reference.

BACKGROUND

The disclosure relates to a pixel circuit and a display unit.

In the technical field of display units that display an image, a display unit utilizing an electric current-driven optical device as a light-emitting device of a pixel has been commercialized in recent years. Such an optical device includes an organic electroluminescence (EL) device, for example. The current-driven optical device has emission luminance which varies depending on a value of a flowing current. The organic EL device is a self-light-emitting device, and thus differs from a device such as a liquid crystal device. The display unit utilizing the organic EL device (organic EL display unit) therefore does not need a light source (backlight), thus is more lightweight, thinner, and higher in luminance than a liquid crystal display unit that needs a light source. Further, the organic EL device has a very high response speed of about several micro seconds, thus preventing the occurrence of an afterimage during display of a motion picture. Hence, the organic EL display unit is expected to be a mainstream next-generation flat panel display.

An active-matrix organic EL display unit has a configuration in which each scanning line is sequentially scanned, and a signal voltage corresponding to an image signal is sampled and is written into a storage capacitor. In other words, the line sequential scanning allows for the writing operation of the signal voltage. Further, in the organic EL display unit in which a threshold voltage and mobility of a driving transistor differ for each pixel, the organic EL device may possibly have irregular luminance, impairing uniformity of a screen. Therefore, the active-matrix organic EL display unit performs correction operation that reduces the irregular luminance caused by the irregular threshold voltage and the irregular mobility of the driving transistor, in addition to the line sequential scanning. For example, reference is made to Japanese Unexamined Patent Application Publication Nos. 2006-133543 and 2006-030921.

SUMMARY

What is demanded is to further reduce irregular luminance by means of correction operation performed by an organic electroluminescence display unit.

It is desirable to provide a pixel circuit and a display unit that make it possible to further reduce irregular luminance.

A pixel circuit according to one embodiment of the technology includes a driving transistor, a write transistor, a first switching transistor, a first storage capacitor, a second switching transistor and a third switching transistor, and a second storage capacitor. The driving transistor is configured to control a current flowing in a light-emitting device. The write transistor is configured to control application of a signal voltage to a source end of the driving transistor. The signal voltage corresponds to an image signal. The first switching transistor is configured to control a gate voltage of the driving transistor upon correction operation that allows a gate-source voltage of the driving transistor to come close to a threshold voltage of the driving transistor. The first storage capacitor is provided at an electrically conductive path between a gate of the driving transistor and the source end of the driving transistor. The second switching transistor and the third switching transistor are provided, in series, at an electrically conductive path between the source end of the driving transistor and a first voltage line. The second storage capacitor is provided at an electrically conductive path between the gate of the driving transistor and a node. The node couples the second switching transistor and the third switching transistor.

A display unit according to one embodiment of the technology is provided with a plurality of pixels and a driving circuit, in which the plurality of pixels each include a light-emitting device and a pixel circuit, and the driving circuit drives the plurality of pixels. In the display unit, the pixel circuit includes the same elements as those of the above-described pixel circuit.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the disclosure.

DETAILED DESCRIPTION

Figure 1:
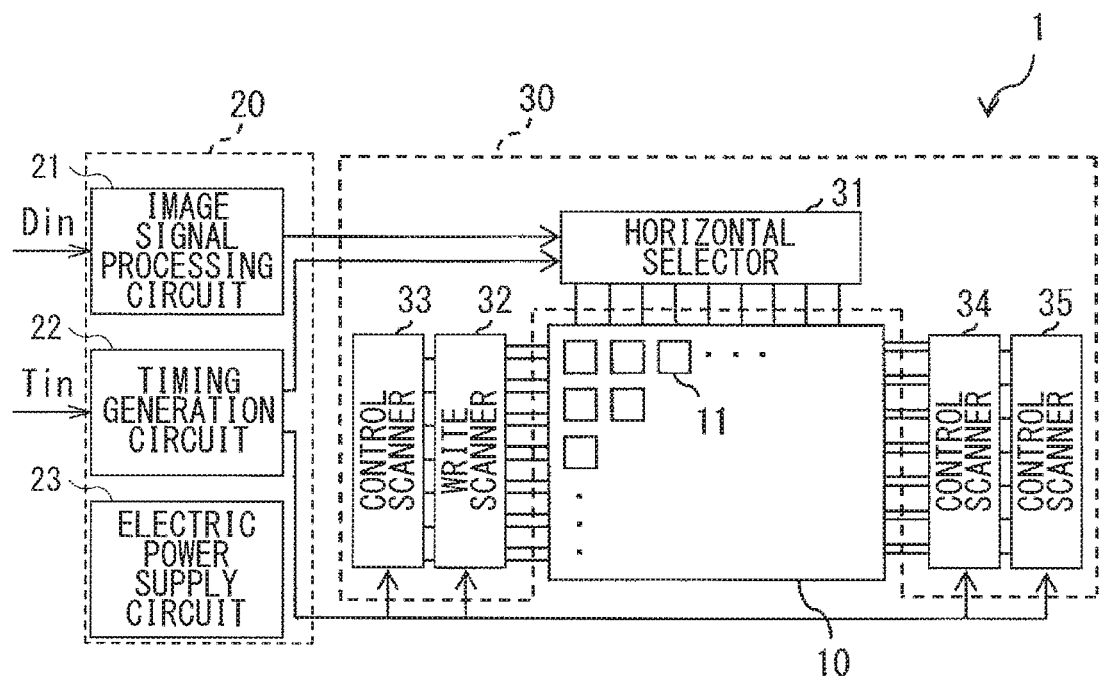
FIG. 1 is a schematic configuration diagram of a display unit according to one embodiment of the disclosure.

Some example embodiments of the disclosure are described below in detail with reference to the accompanying drawings. It is to be noted that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment (Display Unit)
2. Modification Example of First Example Embodiment (Display Unit)
3. Second Example Embodiment (Display Unit)
4. Modification Example of Second Example Embodiment (Display Unit)
5. Third Example Embodiment (Display Unit)
6. Modification Examples common to Each Example Embodiment (Display Unit)
7. Application Example (Electronic Apparatus)

1. First Example Embodiment

[Configuration]

FIG. 1 illustrates a schematic configuration of a display unit 1 according to an embodiment of the disclosure. The display unit 1 may include a pixel array 10, a controller 20, and a driver 30, for example. The controller 20 and the driver 30 correspond to a specific but non-limiting example of a "driving circuit" according to one embodiment of the disclosure. The pixel array 10 may include a plurality of pixels 11 that are disposed in matrix. The controller 20 and the driver 30 may drive the plurality of pixels 11 on the basis of an image signal Din and a synchronizing signal Tin which are supplied from the outside.

[Pixel Array 10]

Figure 2:
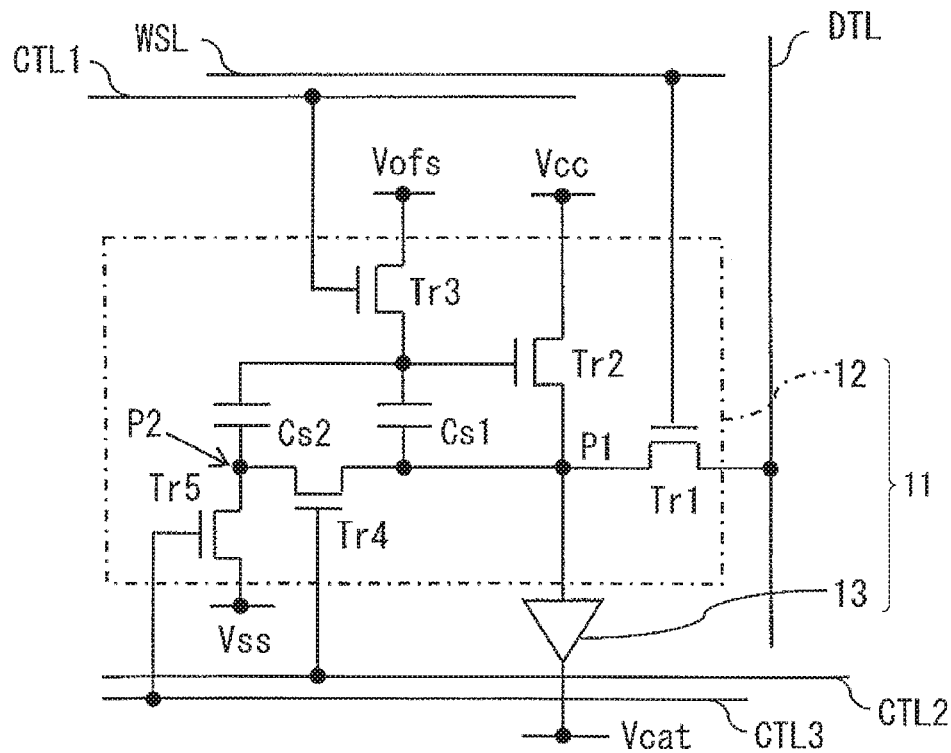
FIG. 2 illustrates an example of a circuit configuration of each of pixels illustrated in FIG. 1.

FIG. 2 illustrates an example of a circuit configuration of each of the pixels 11 included in the pixel array 10. The controller 20 and the driver 30 may perform active-matrix driving each of the pixels to thereby allow the pixel array 10 to display an image based on the image signal Din and the synchronizing signal Tin which are supplied from the outside. The pixel array 10 may include, for example, a plurality of scanning lines WSL, a plurality of control lines CTL1, CTL2, and CTL3, and a plurality of signal lines DTL. The plurality of scanning lines WSL, and the control lines CTL1, CTL2, and CTL3 may extend in a row direction in the circuit configuration of the pixel 11. The plurality of signal lines DTL may extend in a column direction in the circuit configuration of the pixel 11. The pixel array 10 may further include the plurality of pixels 11. The plurality of pixels 11 may be each provided at each intersection between corresponding one of the scanning lines WSL and corresponding one of the signal lines DTL.

The scanning line WSL may be used for selecting each of the pixels 11. The scanning line WSL may supply a selection pulse to each of the pixels 11. The scanning line WSL may select each of the pixels 11 per predetermined unit (e.g., a pixel row) by means of the selection pulse. The signal line DTL may be used for supplying, to each of the pixels 11, a signal voltage Vsig in accordance with the image signal Din. The signal line DTL may supply, to each of the pixels 11, a data pulse including the signal voltage Vsig. The control line CTL1 may supply, to each of the pixels 11, a control pulse that controls on-off of a switching transistor Tr3. The switching transistor Tr3 will be described later. The control line CTL2 may supply, to each of the pixels 11, a control pulse that controls on-off of a switching transistor Tr4. The switching transistor Tr4 will be described later. The control line CTL3 may supply, to each of the pixels 11, a control pulse that controls on-off of a switching transistor Tr5. The switching transistor Tr5 will be described later.

Each of the pixels 11 may include, for example, a pixel circuit 12 and an organic EL device 13. In one embodiment, the organic EL device 13 corresponds to a specific but non-limiting example of a "light-emitting device". The organic EL device 13 may include a configuration in which an anode electrode, an organic layer, and a cathode electrode are stacked in order, for example. The organic EL device 13 may include a device capacitor (i.e., a device capacitor Ce1). The pixel circuit 12 may control light emission and light extinction of the organic EL device 13. The pixel circuit 12 may serve to store a voltage that is written into corresponding one of the pixels 11 by means of write scanning described later. The pixel circuit 12 may include, for example, a write transistor Tr1, a driving transistor Tr2, the switching transistors Tr3, Tr4, and Tr5, and storage capacitors Cs1 and Cs2.

In one embodiment, the switching transistor Tr3 corresponds to a specific but non-limiting example of a "first switching transistor". In one embodiment, the switching transistor Tr4 corresponds to a specific but non-limiting example of a "second switching transistor". In one embodiment, the switching transistor Tr5 corresponds to a specific but non-limiting example of a "third switching transistor". In one embodiment, the storage capacitor Cs1 corresponds to a specific but non-limiting example of a "first storage capacitor". In one embodiment, the storage capacitor Cs2 corresponds to a specific but non-limiting example of a "second storage capacitor".

The write transistor Tr1 controls application of the signal voltage Vsig to a source end P1 of the driving transistor Tr2. The signal voltage Vsig may correspond to the image signal Din. The source end P1 of the driving transistor Tr2 may be adjacent to a terminal of the organic EL device 13. In a specific but non-limiting example, the write transistor Tr1 may sample a voltage of the signal line DTL. The write transistor Tr1 may also write the voltage obtained by the sampling into the source end P1 of the driving transistor Tr2. The driving transistor Tr2 may be coupled in series to the organic EL device 13. The driving transistor Tr2 may drive the organic EL device 13. The driving transistor Tr2 may control a current that flows in the organic EL device 13 in accordance with the level of the voltage sampled by the write transistor Tr1.

The switching transistor Tr3 controls a gate voltage Vg of the driving transistor Tr2 during correction operation that allows a gate-source voltage of the driving transistor Tr2 to come close to a threshold voltage Vth of the driving transistor Tr2. The switching transistor Tr3 is provided at an electrically conductive path between the gate of the driving transistor Tr2 and a fixed voltage line Vofs.

The storage capacitor Cs1 may store a predetermined voltage between a gate and a source of the driving transistor Tr2. The storage capacitor Cs1 is provided at an electrically conductive path between the gate of the driving transistor Tr2 and the source end P1 of the driving transistor Tr2.

The switching transistors Tr4 and Tr5 is provided in series at an electrically conductive path between the source end P1 of the driving transistor Tr2 and a fixed voltage line Vss. In one embodiment, the fixed voltage line Vss corresponds to a specific but non-limiting example of a "first voltage line". The switching transistor Tr4 may be provided between the source end P1 of the driving transistor Tr2 and a node P2. The node P2 may couple the switching transistor Tr4 and the switching transistor Tr5. The switching transistor Tr5 may be provided between the node P2 and the fixed voltage line Vss. Therefore, when the switching transistors Tr4 and Tr5 are turned ON, the switching transistors Tr4 and Tr5 may supply, to the source end P1 of the driving transistor Tr2, a voltage of the fixed voltage line Vss or alternatively, a voltage corresponding to the fixed voltage line Vss.

The storage capacitor Cs2 may store a predetermined voltage between the gate of the driving transistor Tr2 and the node P2. The storage capacitor Cs2 is provided at an electrically conductive path between the gate of the driving transistor Tr2 and the node P2. The capacity of the storage capacitor Cs2 may be, for example, larger than the capacity of the storage capacitor Cs1. One reason for this is to make the gate voltage of the driving transistor Tr2 higher upon signal writing.

The write transistor Tr1, the driving transistor Tr2, and the switching transistors Tr3, Tr4, and Tr5 may each include, for example, an n-channel metal oxide semiconductor (MOS) thin film transistor (TFT). Alternatively, the write transistor Tr1 and the switching transistors Tr3, Tr4, and Tr5 may each include, for example, a p-channel MOS TFT. The following description will be given on the assumption that these transistors are of enhancement type. However, these transistors may be alternatively of depression type.

Each of the signal lines DTL may be coupled to an unillustrated output end of a horizontal selector 31 described later and to one of a source or a drain of the write transistor Tr1. Each of the scanning lines WSL may be coupled to an unillustrated output end of a write scanner 32 and to a gate of the write transistor Tr1.

Each of the control lines CTL1 may be coupled to an unillustrated output end of a control scanner 33 described later and to a gate of the switching transistor Tr3. Each of the control lines CTL2 may be coupled to an unillustrated output end of a control scanner 34 described later and to a gate of the switching transistor Tr4. Each of the control lines CTL3 may be coupled to an unillustrated output end of the control scanner 35 described later and to a gate of the switching transistor Try.

The gate of the write transistor Tr1 may be coupled to the scanning line WSL. One of the source or the drain of the write transistor Tr1 may be coupled to the signal line DTL. The other, of the source and the drain of the write transistor Tr1, that is not coupled to the signal line DTL may be coupled to the source end P1 of the driving transistor Tr2. The driving transistor Tr2 may include a gate that is coupled to a terminal, of the source and the drain of the switching transistor Tr3 that is adjacent to the gate of the driving transistor Tr2. The gate of the driving transistor Tr2 may be further coupled to both the storage capacitor Cs1 and the storage capacitor Cs2. One of the source or the drain of the driving transistor Tr2 may be coupled to a fixed voltage line Vcc. The other (P1), of the source and the drain of the driving transistor Tr2, that is not coupled to the fixed voltage line Vcc may be coupled to the anode of the organic EL device 13.

The gate of the switching transistor Tr3 may be coupled to the control line CTL1. One of the source or the drain of the switching transistor Tr3 may be coupled to the fixed voltage line Vofs. The other, of the source and the drain of the switching transistor Tr3, that is not coupled to the fixed voltage line Vofs may be coupled to all of the gate of the driving transistor Tr2, the storage capacitor Cs1, and the storage capacitor Cs2. The gate of the switching transistor Tr4 may be coupled to the control line CTL2. One of the source or the drain of the switching transistor Tr4 may be coupled to both the source end P1 of the driving transistor Tr2 and the storage capacitor Cs1. The other, of the source and the drain of the switching transistor Tr4, that is not coupled to the source end P1 of the driving transistor Tr2 may be coupled to both the node P2 and the storage capacitor Cs2. The gate of the switching transistor Tr5 may be coupled to the control line CTL3. One of the source or the drain of the switching transistor Tr5 may be coupled to the fixed voltage line Vss. The other, of the source and the drain of the switching transistor Tr5, that is not coupled to the fixed voltage line Vss may be coupled to both the node P2 and the storage capacitor Cs2.

The storage capacitor Cs1 may include one end that is coupled to the gate of the driving transistor Tr2. The storage capacitor Cs1 may include the other end that is coupled to the source end P1 of the driving transistor Tr2. The storage capacitor Cs2 may include one end that is coupled to the gate of the driving transistor Tr2. The storage capacitor Cs2 may include the other end that is coupled to the node P2. The anode of the organic EL device 13 may be coupled to the source end P1 of the driving transistor Tr2. The organic EL device 13 may include a cathode that is coupled to a cathode voltage line Vcat.

The driver 30 may include, for example, the horizontal selector 31, the write scanner 32, and the control scanners 34, 34, and 35.

The horizontal selector 31 may apply an analog signal voltage Vsig to each of the signal lines DTL in response to (in synchronization with) an input of a control signal, for example. The analog signal voltage Vsig may be supplied from an image signal processing circuit 21. In a specific but non-limiting example, the horizontal selector 31 may supply the signal voltage Vsig to the pixel 11 that is selected by the write scanner 32, via corresponding one of the signal lines DTL. The signal voltage Vsig may be a voltage value that corresponds to the image signal Din.

The write scanner 32 may scan the plurality of pixels 11 for each predetermined unit. In a specific but non-limiting example, the write scanner 32 may sequentially output a selection pulse to each of the scanning lines WSL in a 1-frame period. The write scanner 32 may select, in accordance with a predetermined sequence, the plurality of scanning lines WSL in response to (in synchronization with) an input of a control signal, for example, to thereby cause writing of the signal voltage Vsig and light emission to be executed in a desired order. The writing of the signal voltage Vsig (signal writing) means operation of writing the signal voltage Vsig to the source end P1 of the driving transistor Tr2 through the write transistor Tr1.

The write scanner 32 may be able to output two types of voltages (i.e., Von and Voff). In a specific but non-limiting example, the write scanner 32 may supply the two types of voltages (Von and Voff) to a pixel 11 to be driven via corresponding one of the scanning lines WSL, to thereby perform an on-off control of the write transistor Tr1. The ON voltage Von may be equal to or higher than an ON voltage of the write transistor Tr1. The ON voltage Von may be a peak value of a selection pulse that is outputted from the write scanner 32 in a period such as a "writing period" described later. The OFF voltage Voff may be lower than the ON voltage of the write transistor Tr1, and may be lower than the ON voltage Von.

The control scanner 33 may sequentially select the plurality of control lines CTL1 for each predetermined unit in response to (in synchronization with) an input of a control signal, for example. The control scanner 33 may be able to output two types of voltages (i.e., Von and Voff), for example. In a specific but non-limiting example, the control scanner 33 may supply the two types of voltages (Von and Voff) to each of the pixels 11 via corresponding one of the control lines CTL1. The ON voltage Von may be equal to or higher than the ON voltage of the switching transistor Tr3. The OFF voltage Voff may be lower than the ON voltage of the switching transistor Tr3.

The control scanner 34 may sequentially select the plurality of control lines CTL2 for each predetermined unit in response to (in synchronization with) an input of a control signal, for example. The control scanner 34 may be able to output two types of voltages (Von and Voff), for example. In a specific but non-limiting example, the control scanner 34 may supply the two types of voltages (Von and Voff) to each of the pixels 11 via corresponding one of the control lines CTL2. The ON voltage Von may be equal to or higher than the ON voltages of the switching transistor Tr4. The OFF voltage Voff may be lower than the ON voltages of the switching transistor Tr4.

The control scanner 35 may sequentially select the plurality of control lines CTL3 for each predetermined unit in response to (in synchronization with) an input of a control signal, for example. The control scanner 35 may be able to output two types of voltages (Von and Voff), for example. In a specific but non-limiting example, the control scanner 35 may supply the two types of voltages (Von and Voff) to each of the pixels 11 via corresponding one of the control lines CTL3. The ON voltage Von may be equal to or higher than the ON voltage of the switching transistor Tr5. The OFF voltage Voff may be lower than the ON voltage of the switching transistor Tr5.

[Controller 20]

A description will be given next of the controller 20. The controller 20 may include, for example, the image signal processing circuit 21, a timing generation circuit 22, and a power supply circuit 23. The image signal processing circuit 21 may perform a predetermined correction to a digital image signal Din supplied from the outside, for example, and may generate the signal voltage Vsig on the basis of the image signal obtained by the predetermined correction. The image signal processing circuit 21 may output the generated signal voltage Vsig to the horizontal selector 31, for example. Non-limiting examples of the predetermined correction may include gamma correction and overdrive correction. The timing generation circuit 22 may control circuits in the driver 30 to operate in conjunction with one another. The timing generation circuit 22 may output a control signal to each of the circuits in the driver 30 in response to (in synchronization with) a synchronizing signal Tin supplied from the outside. The power supply circuit 23 may generate various fixed voltages necessary for various circuits, and may supply the generated various fixed voltages. Non-limiting examples of the various circuits may include the horizontal selector 31, the write scanner 32, the control scanners 33, 34, and 35, the image signal processing circuit 21, and the timing generation circuit 22.

[Operation]

A description is given next of operation (operation from light extinction to light emission) of the display unit 1 according to the present example embodiment. The present example embodiment may incorporate compensation operation for variation in I-V characteristics of the organic EL device 13, in order to keep luminance of the organic EL device 13 constant without being affected by a possible temporal change in the I-V characteristics of the organic EL device 13. Further, the present example embodiment may incorporate correction operation for variation in the threshold voltage, in order to keep the luminance of the organic EL device 13 constant without being affected by a possible temporal change in the threshold voltage of the driving transistor Tr2.

Figure 3:
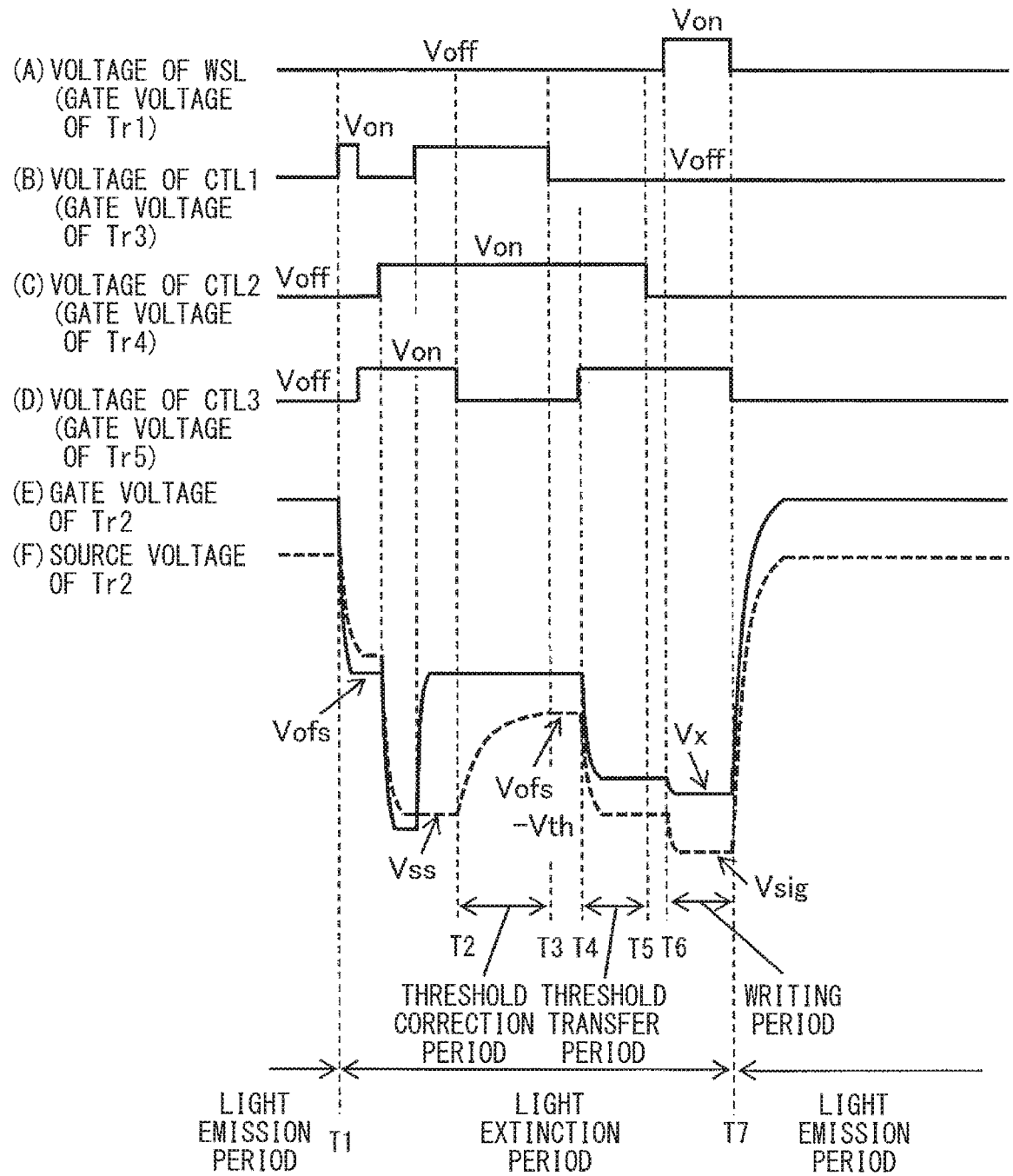
FIG. 3 illustrates an example of a temporal change in each of voltages to be applied to a scanning line and various control lines, and a gate voltage and a source voltage of a driving transistor, when focusing on one pixel.

FIG. 3 illustrates an example of a temporal change in each of voltages to be applied to the scanning line WSL, and the various control lines CTL1, CTL2, and CTL3, and the gate voltage Vg and the source voltage Vs of the driving transistor Tr2, when focusing on one pixel 11. FIGS. 4 to 9 each illustrate an example of operation of the pixel 11.

Figure 4:
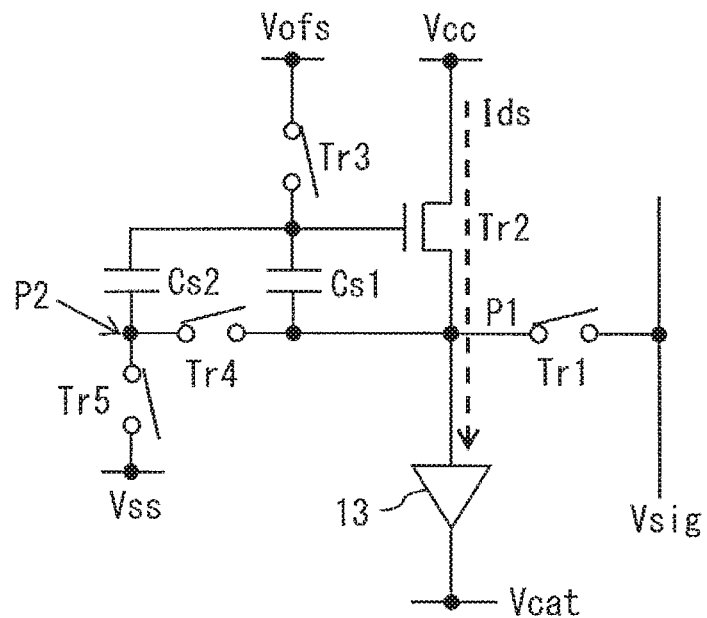
FIG. 4 illustrates an example of operation of a pixel.
Figure 5:
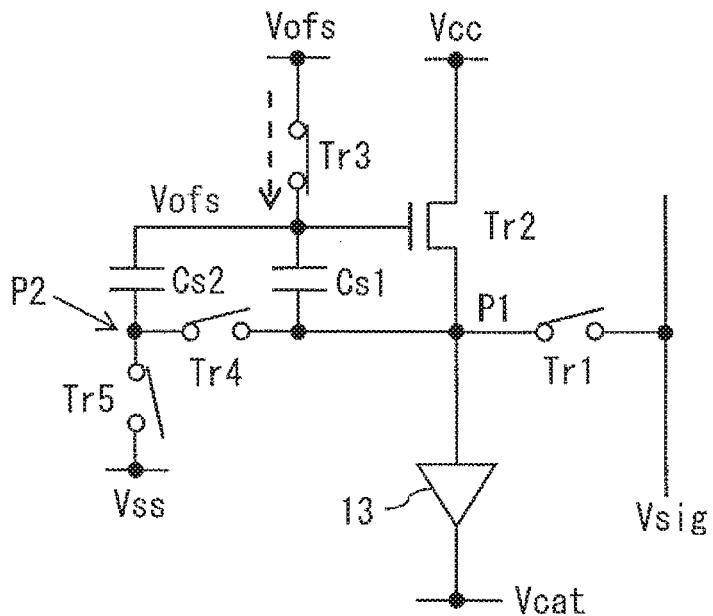
FIG. 5 illustrates an example of operation of a pixel.

First, the controller 20 and the driver 30 may prepare a threshold correction that causes a gate-source voltage Vgs of the driving transistor Tr2 to come close to the threshold voltage Vth of the driving transistor Tr2. The threshold correction may refer to correction operation that causes the gate-source voltage Vgs of the driving transistor Tr2 to come close to a threshold voltage of the driving transistor Tr2. The organic EL device 13 may emit light before preparing the threshold correction. At this occasion, the scanning line WSL may have the voltage Voff, and the control lines CTL1, CTL2, and CTL3 may each have the voltage Voff, as illustrated in FIG. 4. Note that the driving transistor Tr2 may operate in a saturation region. Therefore, the current Ids that flows in the organic EL device 13 may have a value that corresponds to the level of the gate-source voltage Vgs of the driving transistor Tr2.

The controller 20 and the driver 30 may extinguish light of the organic EL device 13 upon starting to prepare the threshold correction. In a specific but non-limiting example, the controller 20 and the driver 30 may cause the switching transistor Tr3 to turn ON (time T1, FIG. 5). At this occasion, the gate of the driving transistor Tr2 may be charged to have the voltage Vofs. When the voltage Vofs with which the gate of the driving transistor Tr2 is charged is lower than the sum of the cathode voltage Vcat, the threshold voltage Vthel of the organic EL device 13, and the threshold voltage Vth of the driving transistor Tr2 (i.e., Vofs<Vcat+Vthel+Vth), the light of the organic EL device 13 may be extinguished. Thereafter, the controller 20 and the driver 30 may turn OFF the switching transistor Tr3.

Figure 6:
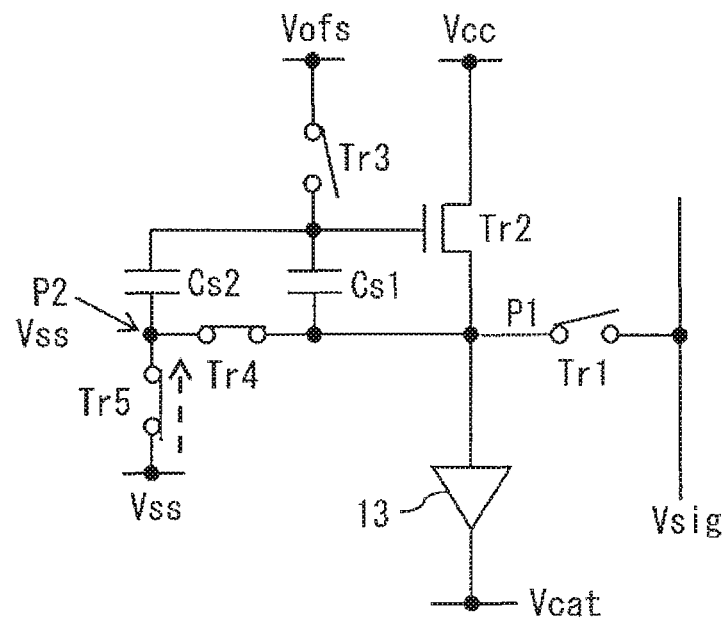
FIG. 6 illustrates an example of operation of a pixel.

After a lapse of a certain period of time, the controller 20 and the driver 30 may turn ON the switching transistors Tr4 and Tr5 (FIG. 6). This operation allows the source end P1 of the driving transistor Tr2 to be charged to have the voltage Vss. This causes the source voltage of the driving transistor Tr2 is lowered. At this occasion, the switching transistor Tr3 may be in an OFF state. Therefore, the gate voltage of the driving transistor Tr2 as well as the source voltage of the driving transistor Tr2 may be lowered, by means of the storage capacitor Cs2. At this occasion, when the voltage Vss with which the source end P1 of the driving transistor Tr2 is charged is lower than the sum of the threshold value Vthel of the organic EL device 13 and the cathode voltage Vcat (i.e., Vss<Vthel+Vcat), light of the organic EL device 13 remains extinguished. Further, it is advantageous for the difference between the voltage Vofs and the voltage Vss to be equal to or higher than the threshold voltage Vth of the driving transistor Tr2 in order to perform the threshold correction operation properly.

Figure 7:
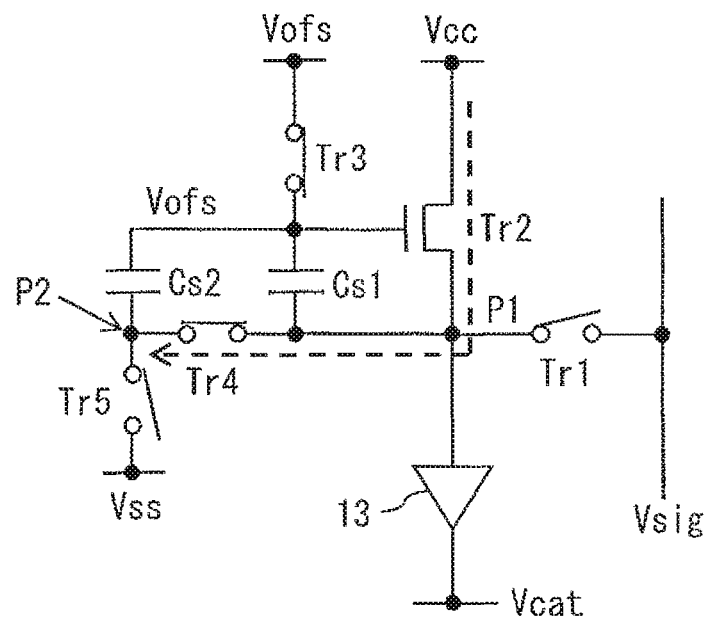
FIG. 7 illustrates an example of operation of a pixel.

Thereafter, the controller 20 and the driver 30 may turn ON the switching transistor Tr3 again, and may cause the gate of the driving transistor Tr2 to have the voltage Vofs again. At this occasion, as described previously, a through-current may flow from the fixed voltage line Vcc to the fixed voltage line Vss when the difference between the voltage Vofs and the voltage Vss is equal to or higher than the threshold voltage Vth of the transistor Tr2. Further, the controller 20 and the driver 30 may turn OFF the switching transistor Tr5 in a threshold correction period (time T2). Turning OFF the switching transistor Tr5 allows a current to flow as illustrated in FIG. 7, and the source voltage of the driving transistor Tr2 may increase. After a lapse of a certain period of time, the gate-source voltage Vgs of the driving transistor Tr2 may be set to be the threshold voltage Vth of the driving transistor Tr2, and the resultant gate-source voltage Vgs may be stored in each of the storage capacitors Cs1 and Cs2. Thereafter, the controller 20 and the driver 30 may turn OFF the switching transistor Tr3 (time T3). Accordingly, upon the correction operation, the controller 20 and the driver 30 turns ON the switching transistor Tr3 to thereby cause the gate of the driving transistor Tr2 to have the fixed voltage Vofs, thereafter turns ON the switching transistors Tr4 and Tr5 to thereby cause the source end P1 to have the fixed voltage Vss, and, following which, turns OFF the switching transistor Tr5.

Figure 8:
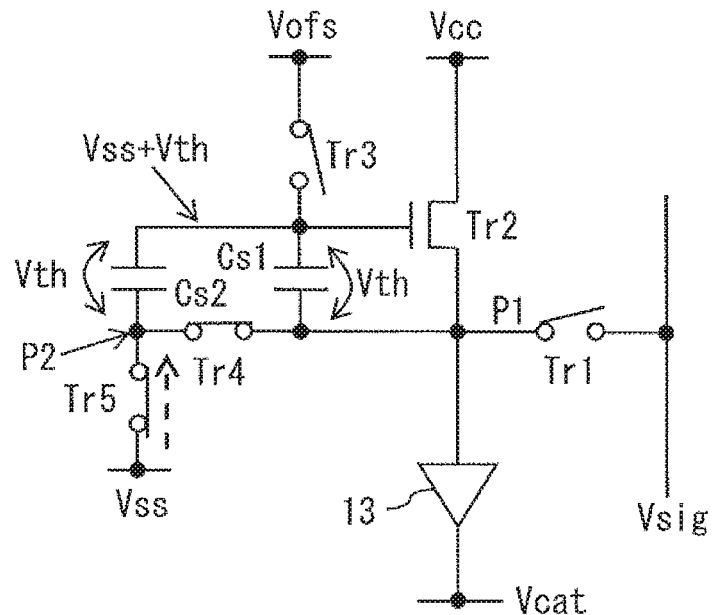
FIG. 8 illustrates an example of operation of a pixel.

Next, the controller 20 and the driver 30 may turn ON the switching transistor Tr5 again while the switching transistor Tr4 is in an ON state, in a threshold transfer period (time T4, FIG. 8). Turning ON the switching transistor Tr5 may cause the source end P1 of the switching transistor Tr2 to have the voltage Vss again. At this occasion, the switching transistor Tr3 may be in an OFF state. Therefore, the gate voltage Vg of the driving transistor Tr2 may be reduced while the gate-source voltage Vgs of the driving transistor Tr2 is kept, by means of the storage capacitors Cs1 and Cs2, at the voltage level of the threshold voltage Vth. After a lapse of a certain period of time, the controller 20 and the driver 30 may turn OFF the switching transistor Tr4 and may cause the threshold transfer to end (time T5).

Figure 9:
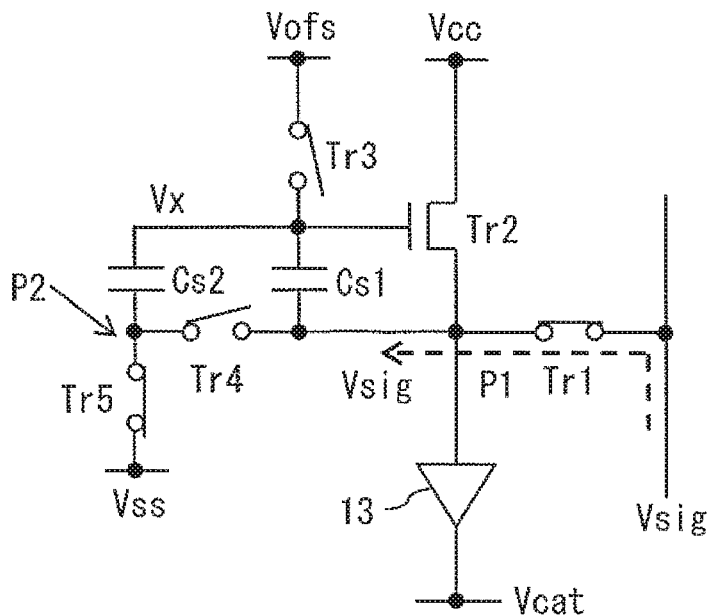
FIG. 9 illustrates an example of operation of a pixel.

Next, in the signal writing period, the controller 20 and the driver 30 may turn ON the write transistor Tr1 while the switching transistor Tr5 is in an ON state, and may write the signal voltage Vsig to the source end P1 of the driving transistor Tr2 (time T6, FIG. 9). In other words, after performing the correction operation, the controller 20 and the driver 30 may turn ON the write transistor Tr1 to thereby apply a voltage corresponding to the signal voltage Vsig to the source end P1. At this occasion, the organic EL device 13 may not emit light if the signal voltage Vsig is equal to or lower than the sum of the cathode voltage Vcat and the threshold voltage Vthl of the organic EL device 13. The signal writing may cause a change in a voltage of the source end P1 of the driving transistor Tr2 to be supplied to the gate of the driving transistor Tr2 through the storage capacitor Cs1. This resultantly allows the gate voltage Vg of the driving transistor Tr2 to become a voltage Vx, as illustrated in FIG. 9. In order to make the voltage Vx higher, it is advantageous that a value of the storage capacitor Cs2 is greater than a value of the storage capacitor Cs1. Further, the gate-source voltage Vgs of the driving transistor Tr2 may include the threshold voltage Vth of the driving transistor Tr2. Therefore, the gate-source voltage Vgs of the driving transistor Tr2 may correspond to the threshold voltage Vth of the driving transistor Tr2. Thereafter, the controller 20 and the driver 30 may turn OFF the write transistor Tr1 and the switching transistor Tr5 upon the end of the signal writing (time T7). This operation may cause a current to flow from the fixed voltage line Vcc, and the organic EL device 13 to emit light (FIG. 4).

Example Effects

A description will be given next of an effect derived from the display unit 1 according to the present example embodiment.

In the present example embodiment, the five transistors and the two storage capacitors may be provided. The five transistors may include the driving transistor Tr2, the write transistor Tr1, the three switching transistors Tr3, Tr4, and Tr5. The two storage capacitors may include the storage capacitors Cs1 and Cs2. This configuration makes it possible to suppress fluctuations of a source potential of the driving transistor Tr2 at least upon writing the signal voltage Vsig to the source end of the driving transistor Tr2. This resultantly makes it possible to reduce the irregular luminance.

In the present example embodiment, the gate-source voltage Vgs of the driving transistor Tr2 is corrected by the threshold correction operation that is performed prior to the signal writing. This makes it possible to correct the fluctuations of the current that flows in the organic EL device 13. Further, the signal voltage Vsig is written to the source of the driving transistor Tr2 upon the signal writing. Therefore, the gate-source voltage Vgs of the driving transistor Tr2 is unchanged without being affected by the fluctuations of the cathode potential. This resultantly makes it possible to obtain uniform image quality without nonuniformity or crosstalk.

2. Modification Example of First Example Embodiment

Figure 10:
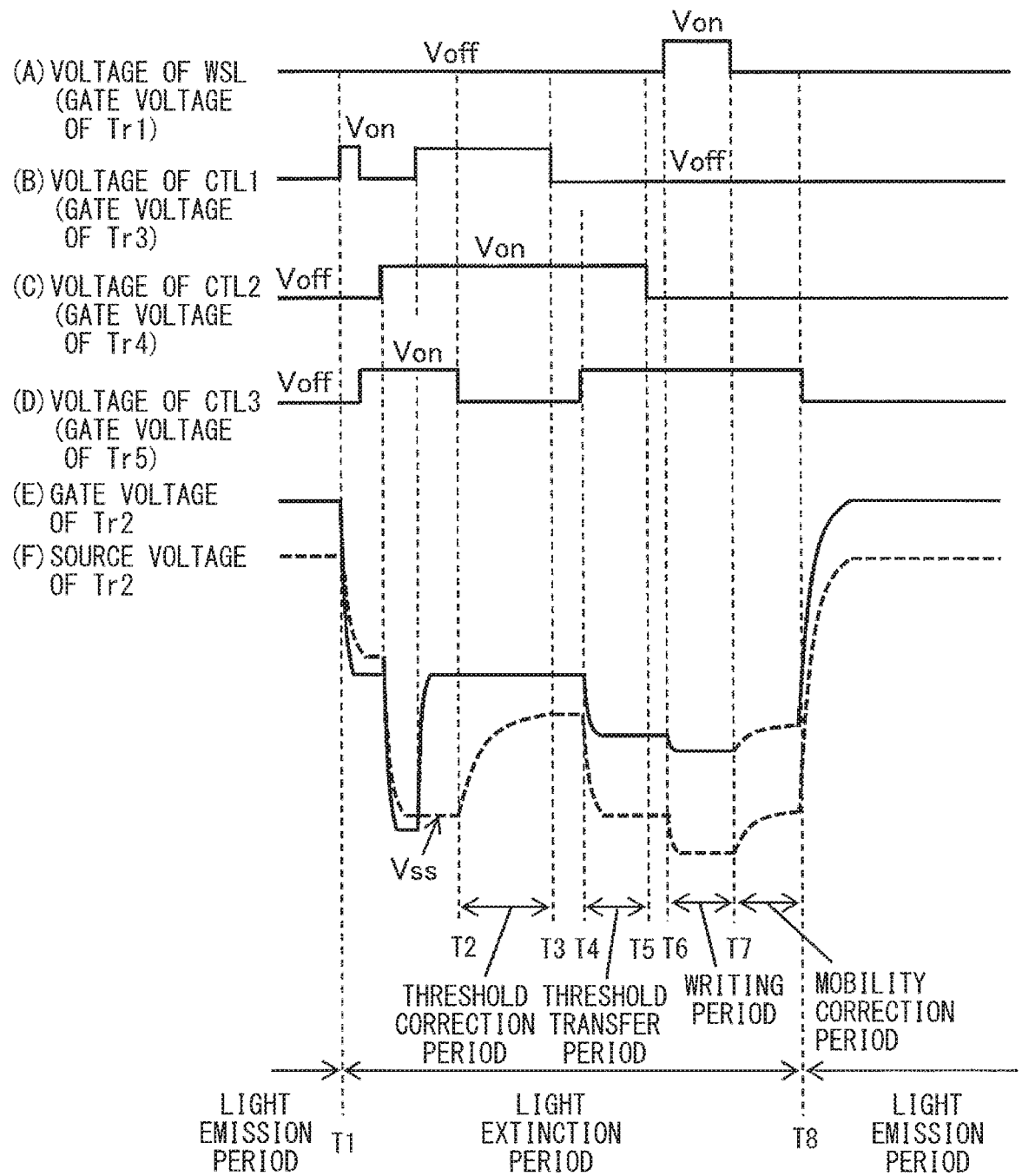
FIG. 10 illustrates a modification example of a temporal change in each of voltage waveforms illustrated in FIG. 3.

In the above-described example embodiment, for example, the controller 20 and the driver 30 may turn OFF the switching transistor Tr5 after turning OFF the write transistor Tr1 to thereby end the signal writing, as illustrated in FIG. 10. In other words, the switching transistor Tr5 may be in an ON state after the signal writing (times T7 to T8 in FIG. 10). This configuration may cause the gate-source voltage Vgs of the driving transistor Tr2 to be set to a value that reflects mobility of the driving transistor Tr2. As a result, it is possible to perform not only the threshold correction but also mobility correction on the driving transistor Tr2.

3. Second Example Embodiment

[Configuration]

Figure 11:
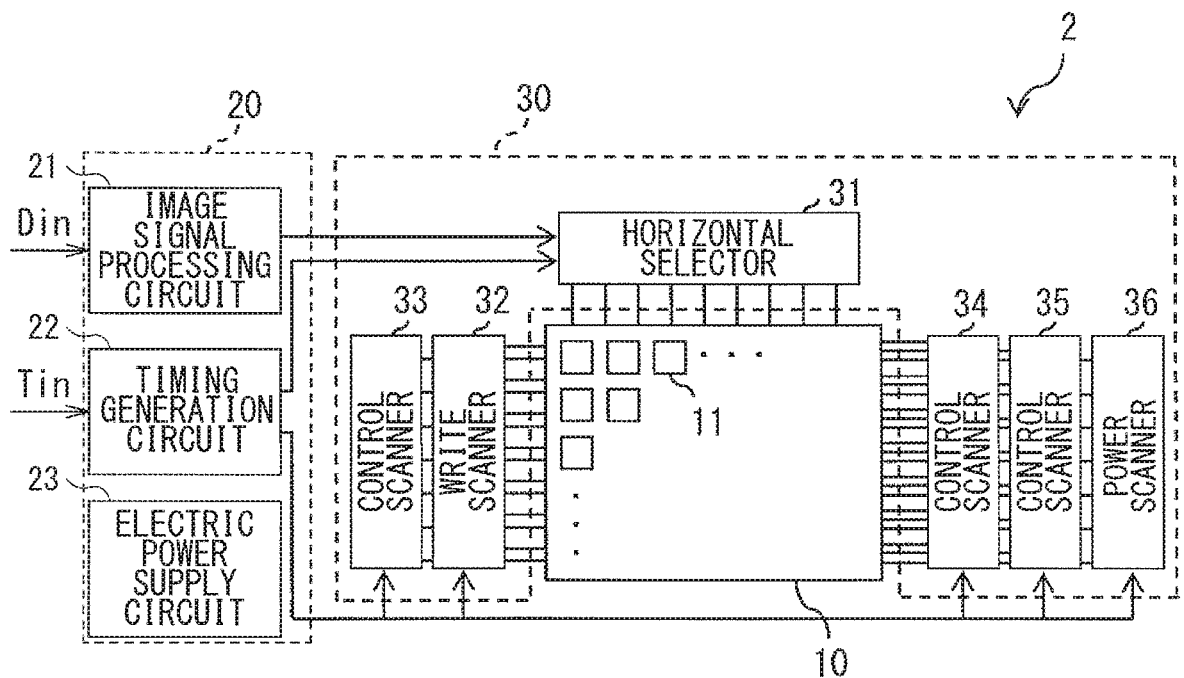
FIG. 11 is a schematic configuration diagram of a display unit according to one embodiment of the disclosure.
Figure 12:
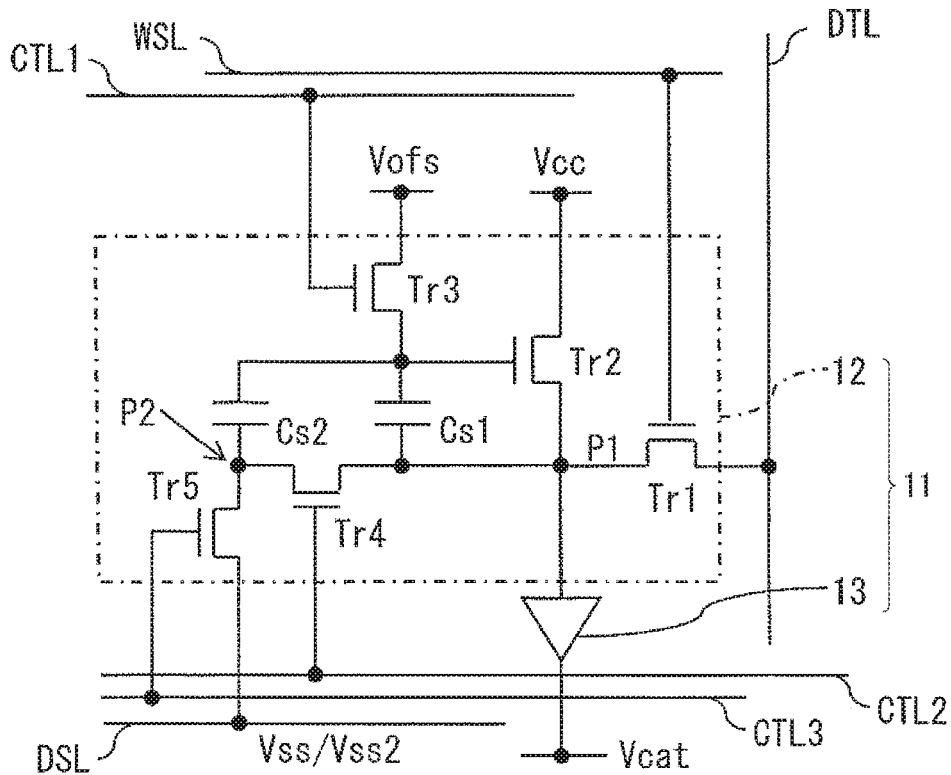
FIG. 12 illustrates an example of a circuit configuration of each of pixels illustrated in FIG. 11.
Figure 13:
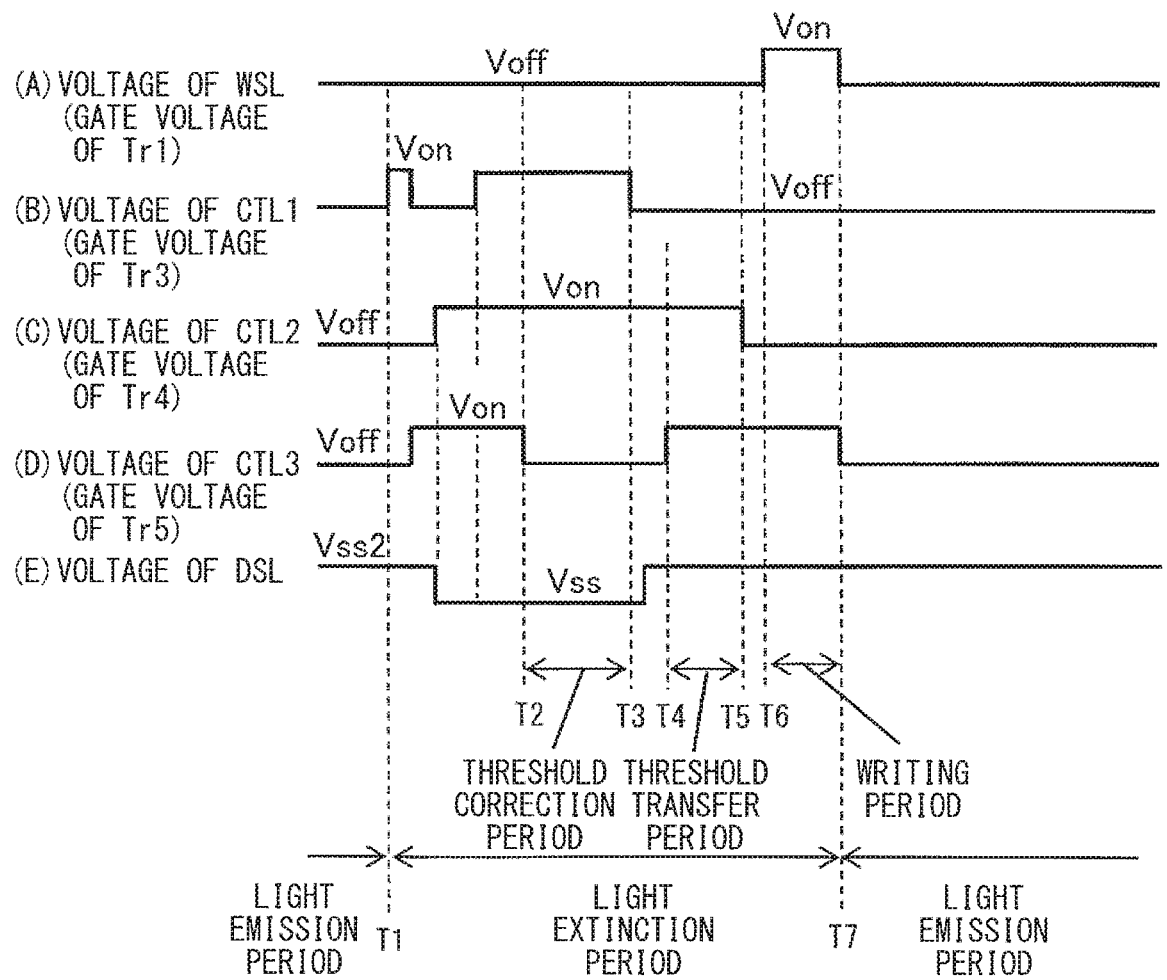
FIG. 13 illustrates an example of a temporal change in each of voltages to be applied to a scanning line and various control lines, when focusing on one pixel.

FIG. 11 illustrates a schematic configuration of a display unit 2 according to the second example embodiment of the disclosure. FIG. 12 illustrates an example of a circuit configuration of each of the pixels 11 included in the pixel array 10 in the display unit 2. The display unit 2 may be similar to the display unit 1 according to the above-described example embodiment except for further including a power supply scanner 36, and that a terminal, of the source and the drain of the switching transistor Tr5, that is not coupled to the node P2 is coupled to the power supply line DSL. FIG. 13 illustrates an example of a temporal change in each of voltages to be applied to the scanning line WSL, the power supply line DSL, and the various control lines CTL1, CTL2, and CTL3, when focusing on one pixel 11.

In the present example embodiment, each of the power supply lines DSL may be coupled to an unillustrated output end of the control scanner 36. The power supply line DSL may also be coupled to a terminal, of the source and the drain of the switching transistor Tr5, that is not coupled to the node P2. The control scanner 36 may, for example, sequentially select the plurality of power supply lines DSL for each predetermined unit in response to (in synchronization with) an input of a control signal, for example. The control scanner 36 may be able to output two types of voltages (i.e., Vss and Vss2), for example. The voltage Vss2 may be higher than the voltage Vss. The control scanner 36 may supply the two types of voltages Vss and Vss2 to each of the pixels 11 through the power supply line DSL. The control scanner 36 may supply the voltage Vss2 to each of the pixels 11 through the power supply line DSL in the threshold transfer period, the writing period, and a light emission period, for example. The control scanner 36 may also supply the voltage Vss to each of the pixels 11 through the power supply line DSL in a threshold correction period, for example.

In the present example embodiment, a potential of the power supply line DSL may be Vss2 upon the signal writing. In the above-described first example embodiment, a change in a voltage of the source end P1 of the driving transistor Tr2 may be supplied to the gate of the driving transistor Tr2 through the storage capacitor Cs1. In this case, it is advantageous to cause the change in the voltage of the source of the driving transistor Tr2 to be in a negative direction. However, it is advantageous for the voltage Vss to be low to a predetermined level in order to perform the threshold correction operation. Moreover, it is advantageous for the horizontal selector 31 to output a voltage that is equal to or higher than a voltage of 0V. For this reason, setting the voltage is difficult in the pixel circuit 12 in the above-described example embodiment. In contrast, in the present example embodiment, the power supply voltage prior to the signal writing may be the voltage Vss2 that is higher than the voltage Vss. This makes it possible to relatively easily perform voltage setting.

4. Modification Example of Second Example Embodiment

Figure 14:
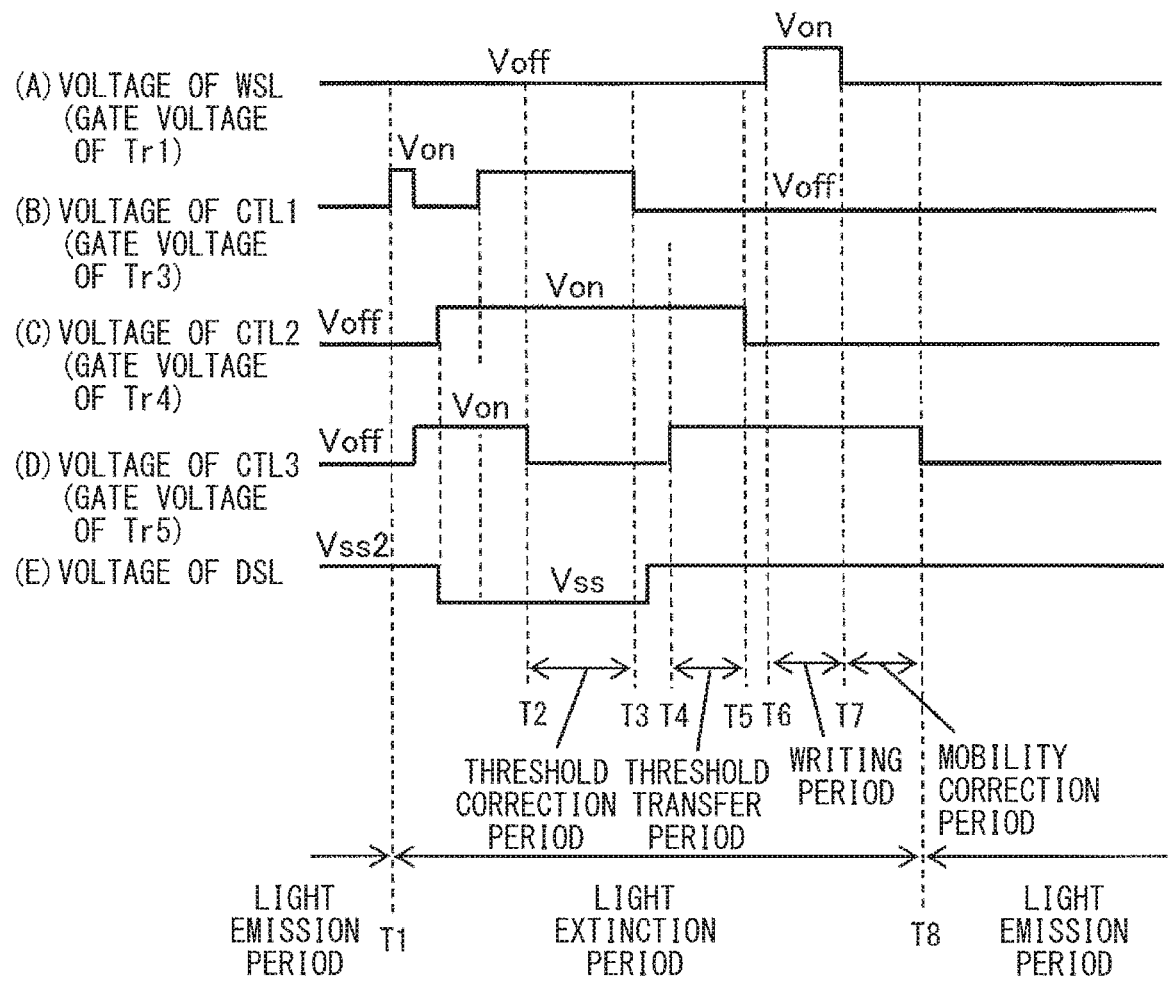
FIG. 14 illustrates a modification example of a temporal change in each of voltage waveforms illustrated in FIG. 13.

In the above-described second example embodiment, for example, the controller 20 and the driver 30 may turn OFF the switching transistor Tr5 after turning OFF the write transistor Tr1 to thereby end the signal writing, as illustrated in FIG. 14. In other words, the switching transistor Tr5 may be in an ON state after the signal writing (times T7 to T8 in FIG. 14). This configuration may cause the gate-source voltage Vgs of the driving transistor Tr2 to be set to a value that reflects mobility of the driving transistor Tr2. As a result, it is possible to perform not only the threshold correction but also mobility correction on the driving transistor Tr2.

5. Third Example Embodiment

Figure 15:
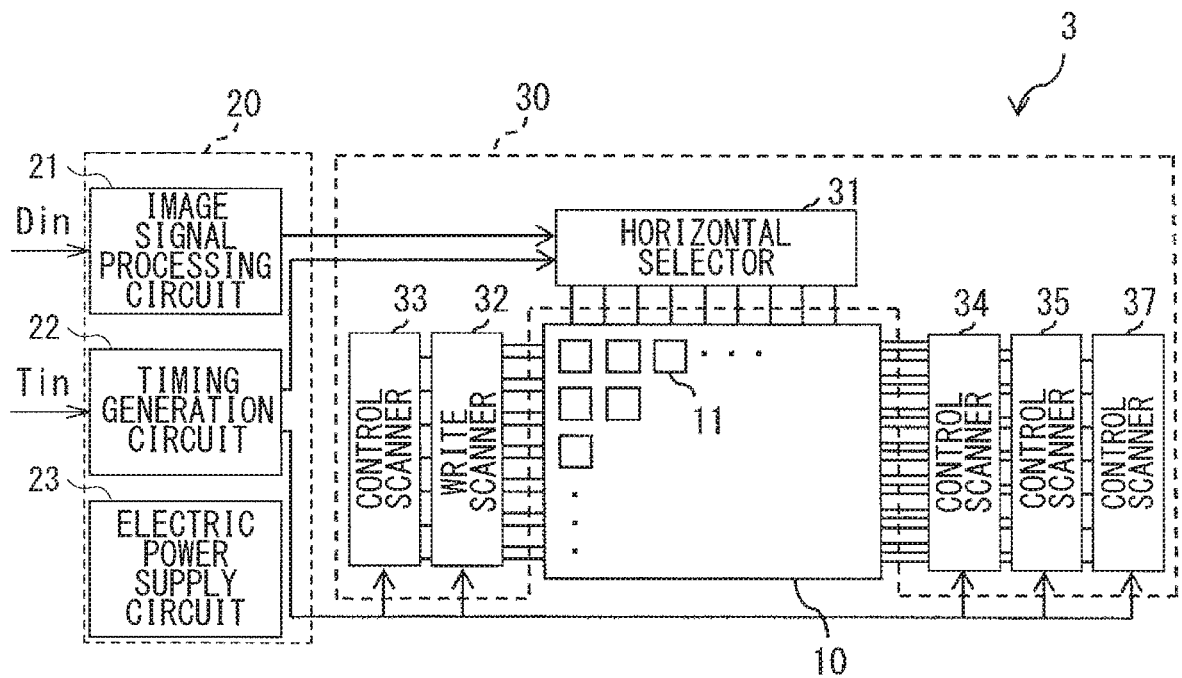
FIG. 15 is a schematic configuration diagram of a display unit according to one embodiment of the disclosure.
Figure 16:
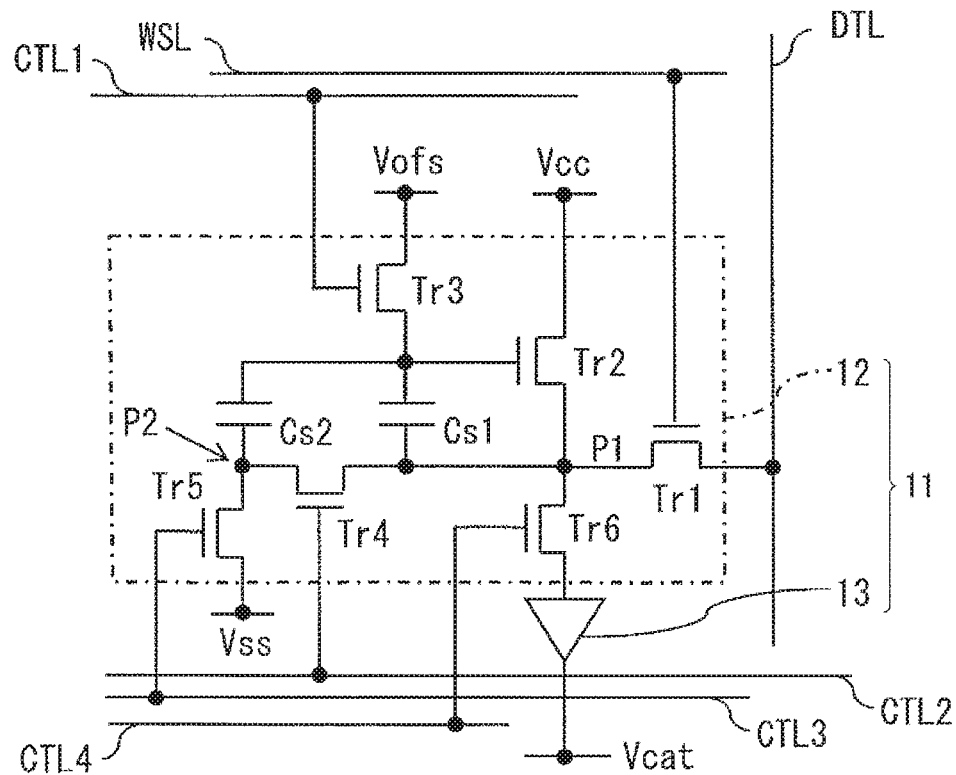
FIG. 16 illustrates an example of a circuit configuration of each of pixels illustrated in FIG. 15.
Figure 17:
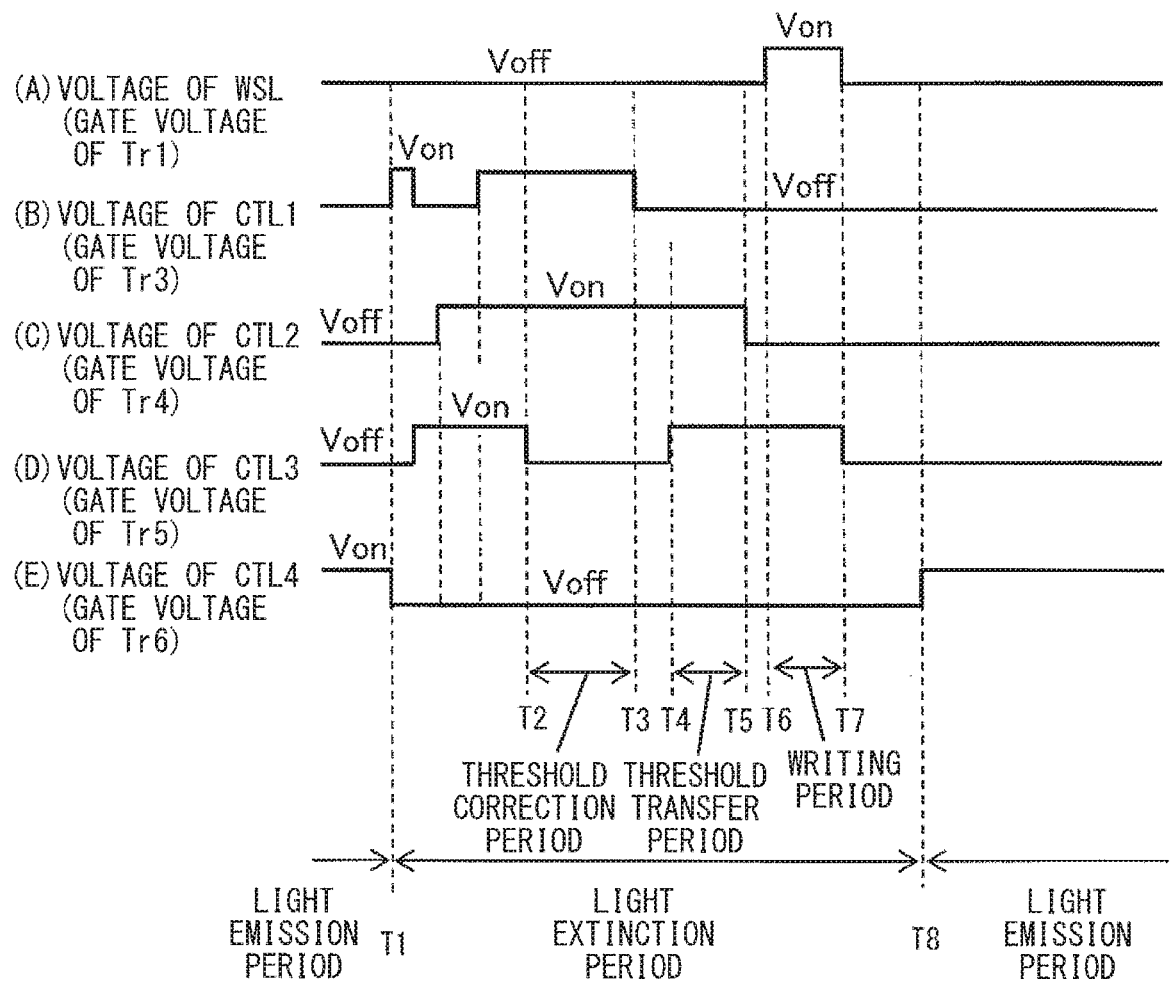
FIG. 17 illustrates an example of a temporal change in each of voltages to be applied to a scanning line and various control lines, when focusing on one pixel.

FIG. 15 illustrates a schematic configuration of a display unit 3 according to the third example embodiment of the disclosure. FIG. 16 illustrates an example of a circuit configuration of each of the pixels 11 included in the pixel array 10 in the display unit 3. FIG. 17 illustrates an example of a temporal change in each of voltages to be applied to the scanning line WSL and the various control lines CTL1, CTL2, CTL3, and CTL4 when focusing on one pixel 11.

The display unit 3 may be similar to the display unit 1 according to the above-described example embodiment except for further including a control scanner 37, and including a switching transistor Tr6 at an electrically conductive path between the source end P1 of the driving transistor Tr2 and the organic EL device 13.

In the present example embodiment, the switching transistor Tr6 may be provided between the source of the driving transistor Tr2 and the organic EL device 13. In the above-described example embodiment, the source voltage of the driving transistor Tr2 is not set to be a fixed voltage in the threshold correction period, and thus, the gate-source voltage Vgs of the driving transistor Tr2 may be affected by the fluctuations of the cathode potential in the threshold correction period. In contrast, in the present example embodiment, both the source of the driving transistor Tr2 and the anode of the organic EL device 13 may not be coupled in the threshold correction period by means of the switching transistor Tr6. Therefore, the gate-source voltage Vgs of the driving transistor Tr2 is prevented from being affected by the fluctuations of the cathode potential in the threshold correction period.

6. Modification Examples Common to Each Example Embodiment

Descriptions are given below of modification examples common to each of the example embodiments. Note that the same reference numerals are assigned to components common to those of the display units 1 to 3 of the above-described example embodiments. Further, descriptions of the components common to those of the display units 1 to 3 of the above-described example embodiments are omitted where appropriate.

Figure 18:
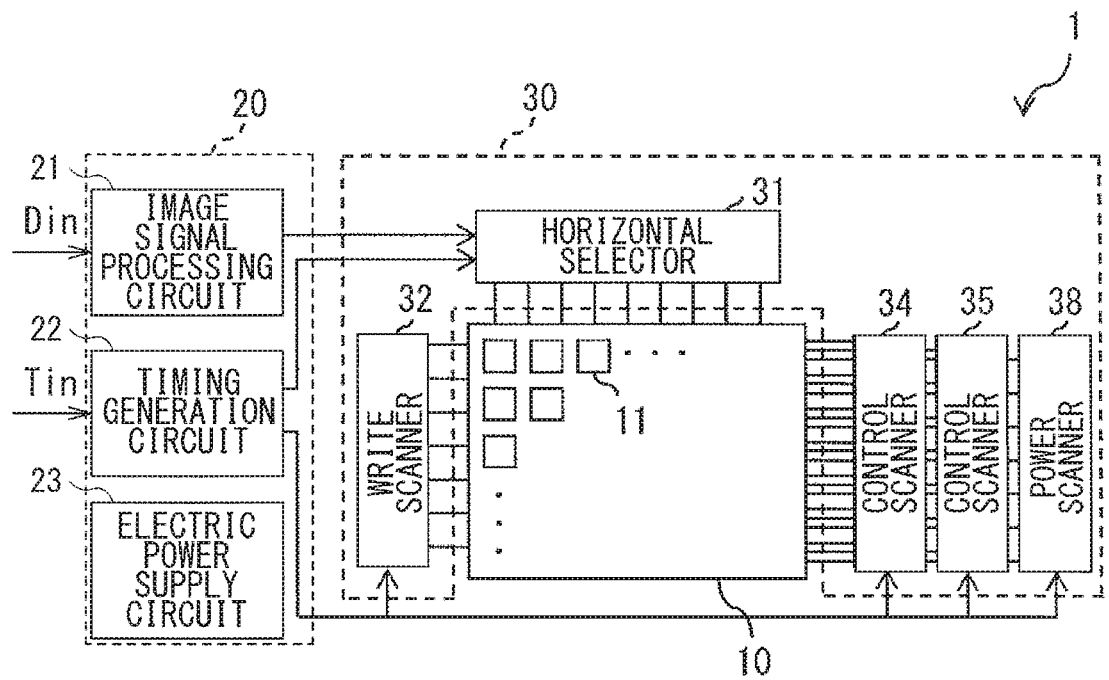
FIG. 18 illustrates a modification example of the schematic configuration of the display unit illustrated in FIG. 1.
Figure 19:
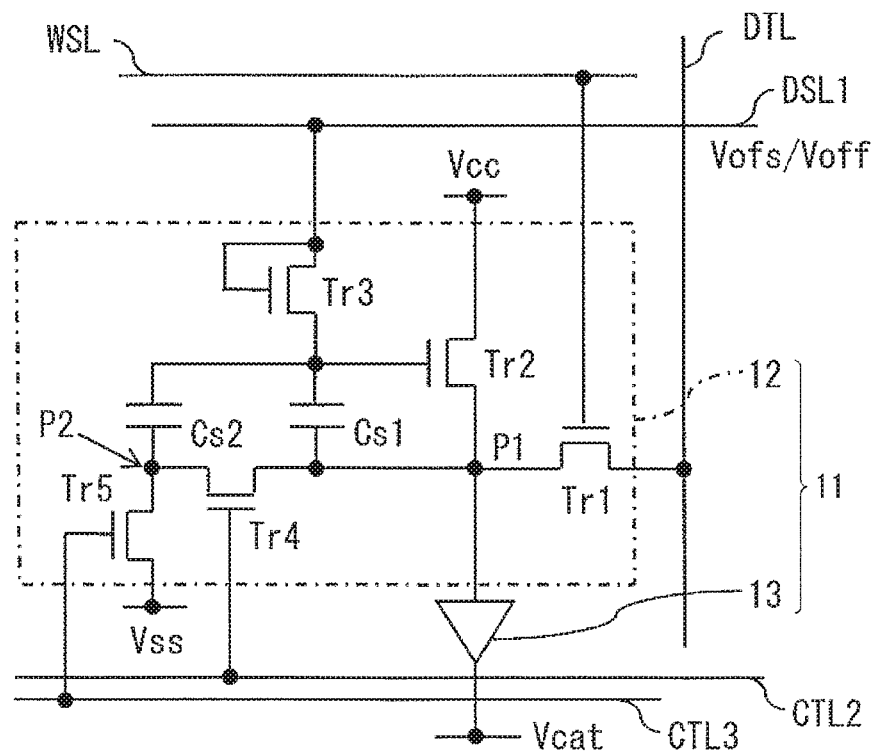
FIG. 19 illustrates a modification example of the circuit configuration of each of the pixels illustrated in FIG. 2.
Figure 20:
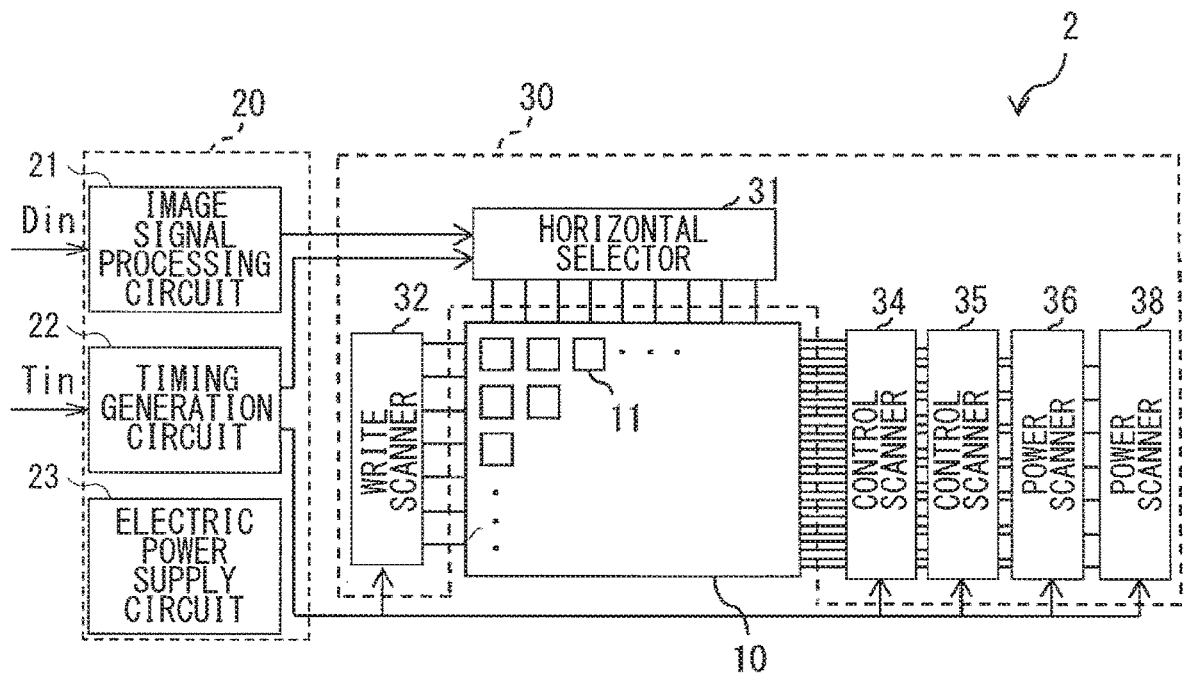
FIG. 20 illustrates a modification example of the schematic configuration of the display unit illustrated in FIG. 11.
Figure 21:
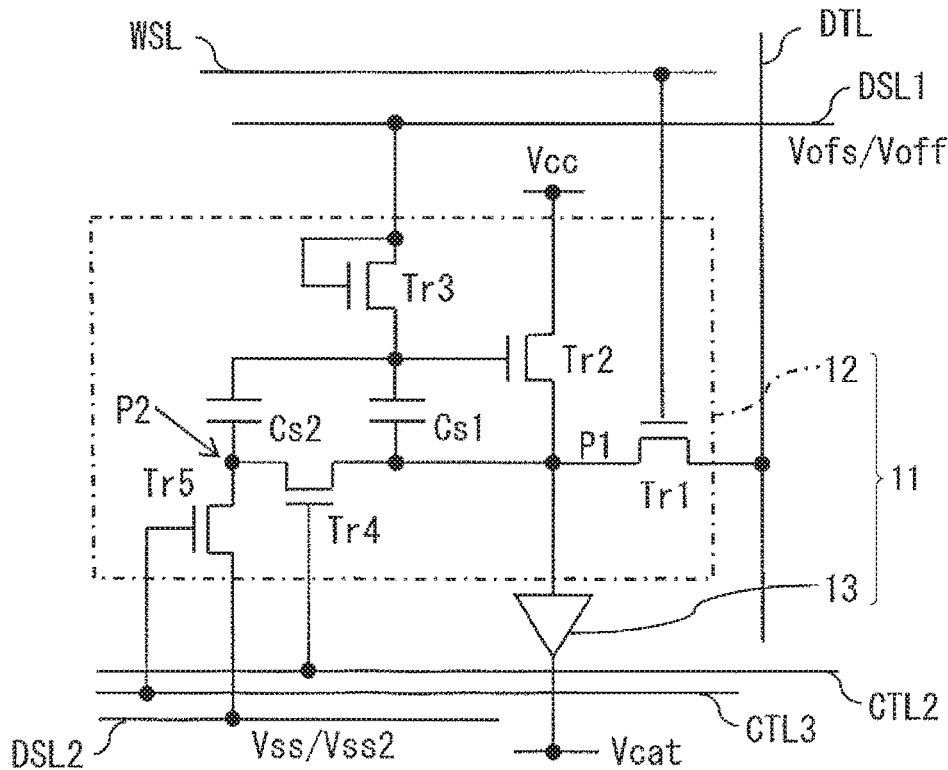
FIG. 21 illustrates a modification example of the circuit configuration of each of the pixels illustrated in FIG. 12.
Figure 22:
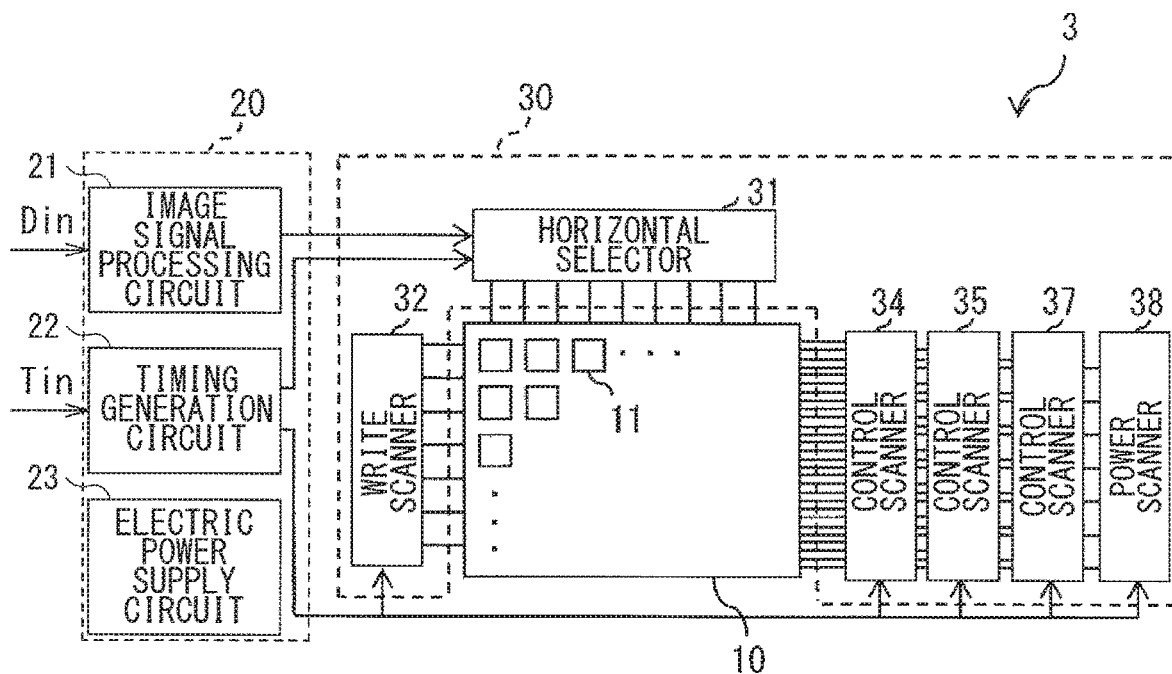
FIG. 22 illustrates a modification example of the schematic configuration of the display unit illustrated in FIG. 15.
Figure 23:
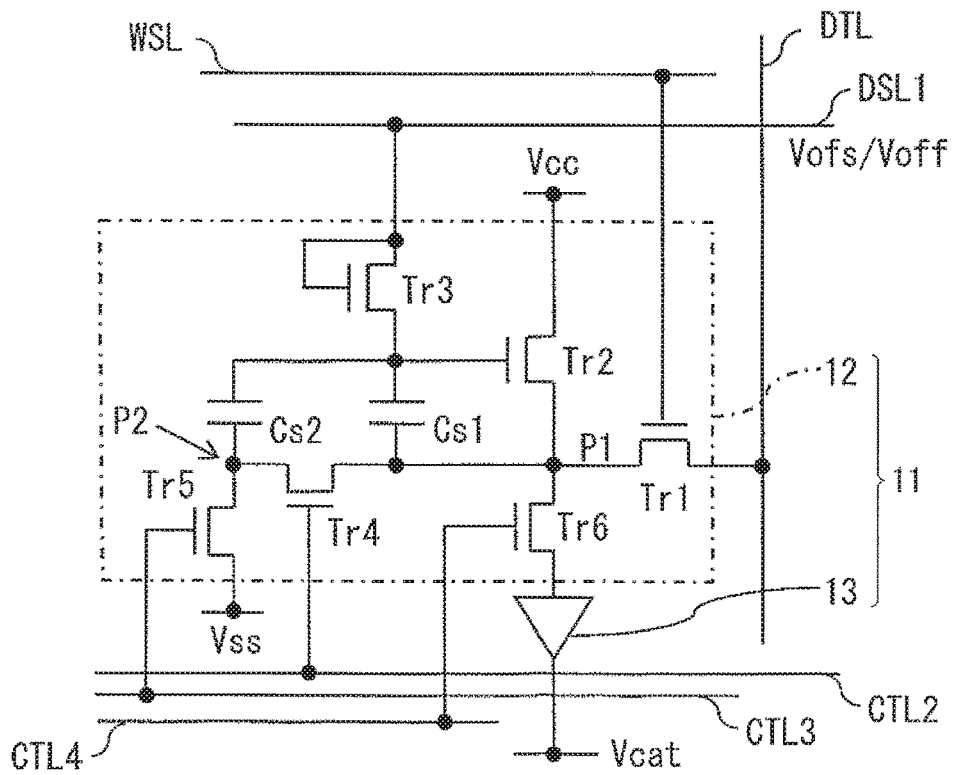
FIG. 23 illustrates a modification example of the circuit configuration of each of the pixels illustrated in FIG. 16.
Figure 24:
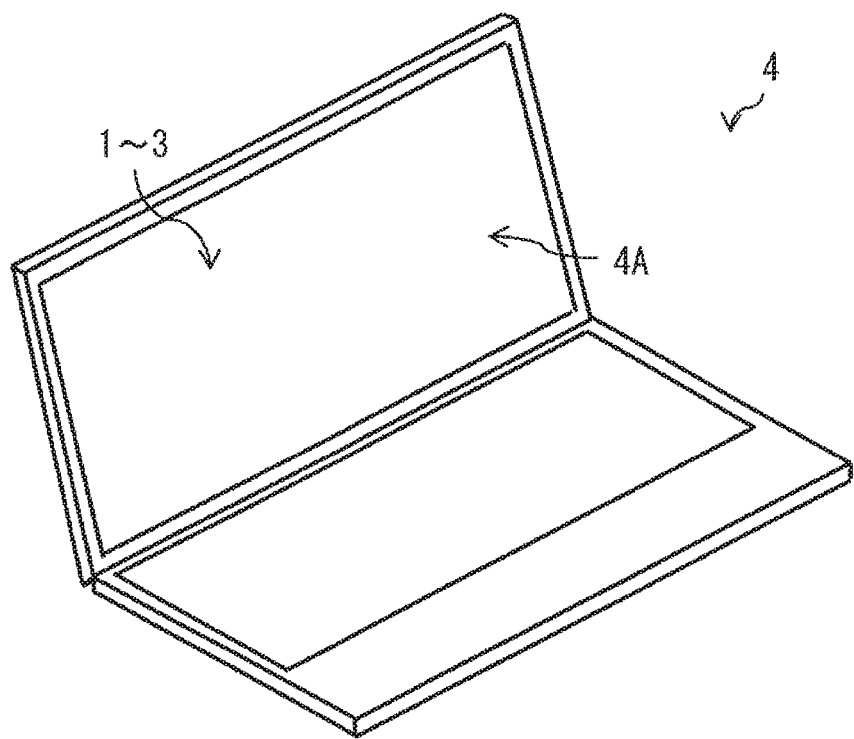
FIG. 24 is a perspective view of an outer appearance of one application example of a display unit according to any one of the above-described example embodiments and the modification examples thereof.

In the display unit 1 according to the above-described first example embodiment and the modification example, for example, the switching transistor Tr3 may be diode-connected, as illustrated in FIGS. 18 and 19. Further, in the display unit 2 according to the second example embodiment and the modification example, for example, the switching transistor Tr3 may be diode-connected, as illustrated in FIGS. 20 and 21. Further, in the display unit 3 according to the third example embodiment and the modification example, for example, the switching transistor Tr3 may be diode-connected, as illustrated in FIGS. 22 and 23. At this occasion, the driver 30 may further include a power supply scanner 38, as illustrated in FIGS. 18, 20, and 22, for example. The power supply scanner 38 may apply two types of voltages (i.e., Vofs and Voff) to a power supply line DSL1. The power supply line DSL1 may be coupled to an anode terminal of the switching transistor Tr3, as illustrated in FIGS. 19, 21, and 23, for example. The voltage Vofs may cause the diode-connected switching transistor Tr3 to turn ON. The voltage Voff may cause the diode-connected switching transistor Tr3 to turn OFF. The power supply scanner 38 may apply the two types of voltages (Vofs and Voff) to the power supply line DSL1, for example, to thereby perform on-off operation on the switching transistor Tr3. The on-off operation may be illustrated, for example, in (B) of FIG. 3, (B) of FIG. 10, (B) of FIG. 13, (B) of FIG. 14, and (B) of FIG. 17.

The threshold transfer operation may be performed in the pixel circuit 12 after the threshold correction operation. For this reason, it is unnecessary to improve the accuracy of a voltage to be supplied to the gate of the driving transistor Tr2 upon the correction operation. Therefore, the diode-connecting of the switching transistor Tr3 is allowed, as illustrated in the present modification example.

7. Application Example

A description is given below of an application example of any of the display units 1 to 3 according to the above-described example embodiments and the modification examples thereof (hereinafter, referred to as "the above-described example embodiments, etc."). The display units 1 to 3 of the above-described example embodiments are applicable to a display unit of an electronic apparatus in various fields, which may display an image signal supplied from the outside or an image signal generated inside, as an image or as a picture. Non-limiting examples of the electronic apparatus with such a display unit may include a television, a digital camera, a laptop personal computer, a portable terminal unit such as a mobile phone, and a video camera.

FIG. 22 illustrates a schematic configuration example of an electronic apparatus 4 according to the present application example. The electronic apparatus 4 may be a laptop foldable personal computer including a display surface 4A on a main surface of one of two plate-shaped casings, for example. The electronic apparatus 4 may include any of the display units 1 to 3 according to the above-described example embodiment, etc., as well as the pixel array 10 at a location of the display surface 4A, for example. Any of the display units 1 to 3 is provided in the present application example, thus making it possible to reduce the irregular luminance.

Although the disclosure has been described hereinabove by way of example with reference to the example embodiment, the modification example, and the application example, the disclosure is not limited thereto but may be modified in a wide variety of ways. Moreover, the effects described hereinabove are mere examples. The effects according to an embodiment of the disclosure are not limited to those described hereinabove. The disclosure may further include other effects in addition to the effects described hereinabove.

It should be understood by those skilled in the art that various modifications, combinations, sub-combinations, and alterations may occur depending on design requirements and other factors insofar as they are within the scope of the appended claims or the equivalents thereof.

For example, the disclosure may also have the following configurations.

(1) A pixel circuit including:
a driving transistor configured to control a current flowing in a light-emitting device;
a write transistor configured to control application of a signal voltage to a source end of the driving transistor, the signal voltage corresponding to an image signal;
a first switching transistor configured to control a gate voltage of the driving transistor upon correction operation that allows a gate-source voltage of the driving transistor to come close to a threshold voltage of the driving transistor;
a first storage capacitor provided at an electrically conductive path between a gate of the driving transistor and the source end of the driving transistor;
a second switching transistor and a third switching transistor provided, in series, at an electrically conductive path between the source end of the driving transistor and a first voltage line; and
a second storage capacitor provided at an electrically conductive path between the gate of the driving transistor and a node, the node coupling the second switching transistor and the third switching transistor.

(2) The pixel circuit according to (1), further including:
a fourth switching transistor provided at an electrically conductive path between the source end of the driving transistor and the light-emitting device.

(3) The pixel circuit according to (1) or (2), in which the first switching transistor is diode-connected.

(4) A display unit provided with a plurality of pixels and a driving circuit, the plurality of pixels each including a light-emitting device and a pixel circuit, the driving circuit being configured to drive the plurality of pixels, the pixel circuit including:
a driving transistor configured to control a current flowing in a light-emitting device;
a write transistor configured to control application of a signal voltage to a source end of the driving transistor, the signal voltage corresponding to an image signal;
a first switching transistor configured to control a gate voltage of the driving transistor upon correction operation that allows a gate-source voltage of the driving transistor to come close to a threshold voltage of the driving transistor;
a first storage capacitor provided at an electrically conductive path between a gate of the driving transistor and the source end of the driving transistor;
a second switching transistor and a third switching transistor provided, in series, at an electrically conductive path between the source end of the driving transistor and a first voltage line; and
a second storage capacitor provided at an electrically conductive path between the gate of the driving transistor and a node, the node coupling the second switching transistor and the third switching transistor.

(5) The display unit according to (4), in which
the driving circuit outputs at least both a first voltage and a second voltage to the first voltage line,
the first voltage is outputted upon the correction operation, and
the second voltage is outputted upon the application of the signal voltage, and is higher than the first voltage.

(6) The display unit according to (4), in which the pixel circuit further includes a fourth switching transistor provided at an electrically conductive path between the source end of the driving transistor and the light-emitting device.

(7) The display unit according to any one of (4) to (6), in which the first switching transistor is diode-connected.

(8) The display unit according to any one of (4) to (7), in which, upon the correction operation, the driving circuit
turns ON the first switching transistor to cause the gate of the driving transistor to have a first fixed voltage,
turns ON the second switching transistor and the third switching transistor to cause the source end of the driving transistor to have a second fixed voltage, and
turns OFF the third switching transistor.
(9) The display unit according to any one of (4) to (8), in which the signal voltage is equal to or lower than a sum of a cathode voltage of the light-emitting device and a threshold voltage of the light-emitting device.
(10) The display unit according to any one of (4) to (9), in which the driving circuit applies a voltage corresponding to the signal voltage to the source end by turning ON the write transistor after performing the correction operation.

In the pixel circuit and the display unit according to one embodiment of the disclosure, the five transistors and the two storage capacitors are provided. The five transistors include the driving transistor, the write transistor, the first switching transistor, the second switching transistor, and the third switching transistor. The two storage capacitors include the first storage capacitor and the second capacitor. This configuration makes it possible to suppress fluctuations of a source potential of the driving transistor at least upon writing a signal voltage to the source end of the driving transistor.

In the pixel circuit and the display unit according to one embodiment of the disclosure, it is possible to suppress the fluctuations of the source potential of the driving transistor at least upon writing the signal voltage to the gate of the driving transistor. Accordingly, it is possible to reduce the irregular luminance. The effects of the disclosure are not limited to those described hereinabove. The disclosure may include some effects different from those described hereinabove and may further include additional effects.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:
1. A pixel circuit comprising:
a driving transistor configured to control a current flowing in a light-emitting device;
a write transistor configured to control application of a signal voltage to a source end of the driving transistor, the signal voltage corresponding to an image signal;
a first switching transistor configured to control a gate voltage of the driving transistor upon correction operation that allows a gate-source voltage of the driving transistor to come close to a threshold voltage of the driving transistor;
a first storage capacitor provided at an electrically conductive path between a gate of the driving transistor and the source end of the driving transistor;
a second switching transistor and a third switching transistor disposed, in series, so as to selectively provide an electrically conductive path between the source end of the driving transistor and a first voltage line; and
a second storage capacitor provided at an electrically conductive path between the gate of the driving transistor and a node, the node coupling the second switching transistor and the third switching transistor.

2. The pixel circuit according to claim 1, further comprising:
a fourth switching transistor disposed so as to selectively provide an electrically conductive path between the source end of the driving transistor and the light-emitting device.

3. The pixel circuit according to claim 1, wherein the first switching transistor is diode-connected.

4. The pixel circuit according to claim 1, wherein
the second switching transistor is configured to switch between an ON state and an OFF state in response to a first control signal at a gate of the second switching transistor, and
the third switching transistor is configured to switch between an ON state and an OFF state in response to a second control signal at a gate of the third switching transistor.

5. The pixel circuit according to claim 4, wherein the second switching transistor and the third switching transistor are configured to provide the electrically conductive path between the source end of the driving transistor and the first voltage line when the second switching transistor is in the ON state and the third switching transistor is in the ON state.

6. The pixel circuit according to claim 4, wherein the second switching transistor and the third switching transistor are configured to interrupt the electrically conductive path between the source end of the driving transistor and the first voltage line when the second switching transistor is in the OFF state and/or the third switching transistor is in the OFF state.

7. The pixel circuit according to claim 1, wherein, during the correction operation, the second switching transistor is in an ON state to cause the source end of the driving transistor to have a fixed voltage, and the third switching transistor is in an OFF state.

8. A display unit provided with a plurality of pixels and a driving circuit, the plurality of pixels each including a light-emitting device and a pixel circuit, the driving circuit being configured to drive the plurality of pixels, the pixel circuit comprising:
a driving transistor configured to control a current flowing in a light-emitting device;
a write transistor configured to control application of a signal voltage to a source end of the driving transistor, the signal voltage corresponding to an image signal;
a first switching transistor configured to control a gate voltage of the driving transistor upon correction operation that allows a gate-source voltage of the driving transistor to come close to a threshold voltage of the driving transistor;

a first storage capacitor provided at an electrically conductive path between a gate of the driving transistor and the source end of the driving transistor;

a second switching transistor and a third switching transistor disposed, in series, so as to selectively provide an electrically conductive path between the source end of the driving transistor and a first voltage line; and a second storage capacitor provided at an electrically conductive path between the gate of the driving transistor and a node, the node coupling the second switching transistor and the third switching transistor.

9. The display unit according to claim 8, wherein
the driving circuit outputs at least both a first voltage and a second voltage to the first voltage line,
the first voltage is outputted upon the correction operation, and
the second voltage is outputted upon the application of the signal voltage, and is higher than the first voltage.

10. The display unit according to claim 8, wherein the pixel circuit further includes a fourth switching transistor disposed so as to selectively provide at an electrically conductive path between the source end of the driving transistor and the light-emitting device.

11. The display unit according to claim 8, wherein the first switching transistor is diode-connected.

12. The display unit according to claim 8, wherein, upon the correction operation, the driving circuit turns ON the first switching transistor to cause the gate of the driving transistor to have a first fixed voltage,
turns ON the second switching transistor and the third switching transistor to cause the source end of the driving transistor to have a second fixed voltage, and, turns OFF the third switching transistor.

13. The display unit according to claim 8, wherein the signal voltage is equal to or lower than a sum of a cathode voltage of the light-emitting device and a threshold voltage of the light-emitting device.

14. The display unit according to claim 8, wherein the driving circuit applies a voltage corresponding to the signal voltage to the source end by turning ON the write transistor after performing the correction operation.

15. The display unit according to claim 8, wherein
the second switching transistor is configured to switch between an ON state and an OFF state in response to a first control signal at a gate of the second switching transistor, and
the third switching transistor is configured to switch between an ON state and an OFF state in response to a second control signal at a gate of the third switching transistor.

16. The display unit according to claim 15, wherein the second switching transistor and the third switching transistor are configured to provide the electrically conductive path between the source end of the driving transistor and the first voltage line when the second switching transistor is in the ON state and the third switching transistor is in the ON state.

17. The display unit according to claim 15, wherein the second switching transistor and the third switching transistor are configured to interrupt the electrically conductive path between the source end of the driving transistor and the first voltage line when the second switching transistor is in the OFF state and/or the third switching transistor is in the OFF state.

18. A display unit provided with a plurality of pixels and a driving circuit, the plurality of pixels each including a light-emitting device and a pixel circuit, the driving circuit being configured to drive the plurality of pixels, the pixel circuit comprising:

a driving transistor configured to control a current flowing in a light-emitting device;

a write transistor configured to control application of a signal voltage to a source end of the driving transistor, the signal voltage corresponding to an image signal;

a first switching transistor configured to control a gate voltage of the driving transistor upon correction operation that allows a gate-source voltage of the driving transistor to come close to a threshold voltage of the driving transistor;

a first storage capacitor provided at an electrically conductive path between a gate of the driving transistor and the source end of the driving transistor;

a second switching transistor and a third switching transistor provided, in series, at an electrically conductive path between the source end of the driving transistor and a first voltage line; and a second storage capacitor provided at an electrically conductive path between the gate of the driving transistor and a node, the node coupling the second switching transistor and the third switching transistor, wherein the driving circuit outputs at least both a first voltage and a second voltage to the first voltage line,
the first voltage is outputted upon the correction operation, and
the second voltage is outputted upon the application of the signal voltage, and is higher than the first voltage.

19. The display unit according to claim 18, wherein, upon the correction operation, the driving circuit turns ON the first switching transistor to cause the gate of the driving transistor to have a first fixed voltage,
turns ON the second switching transistor and the third switching transistor to cause the source end of the driving transistor to have a second fixed voltage, and, turns OFF the third switching transistor.

20. The display unit according to claim 18, wherein the signal voltage is equal to or lower than a sum of a cathode voltage of the light-emitting device and a threshold voltage of the light-emitting device.

* * * * *